United States Patent [19]

Field et al.

[11] Patent Number: 5,302,627
[45] Date of Patent: Apr. 12, 1994

[54] METHOD OF INDICATING A CURE POINT FOR ULTRAVIOLET RADIATION CURING COMPOSITIONS BY COLOR CHANGE

[75] Inventors: Arthur J. Field, Kawkawlin; Michael R. Strong, Midland, both of Mich.

[73] Assignee: Dow Corning Corporation, Midland, Mich.

[21] Appl. No.: 848,579

[22] Filed: Mar. 9, 1992

Related U.S. Application Data

[63] Continuation-in-part of Ser. No. 635,061, Dec. 28, 1990, abandoned.

[51] Int. Cl.$^5$ .................. C08F 2/50; C08F 283/04; C08F 283/12; C08G 18/04
[52] U.S. Cl. ........................... 522/13; 522/16; 522/48; 522/26; 522/75; 522/99; 522/96; 522/42
[58] Field of Search .............. 522/21, 48, 99, 13, 522/75, 96, 26, 42

[56] References Cited

U.S. PATENT DOCUMENTS

| | | | |
|---|---|---|---|
| 3,625,744 | 1/1971 | Juna et al. | 117/93.31 |
| 4,374,967 | 2/1983 | Brown et al. | 528/15 |
| 4,587,137 | 5/1986 | Eckberg | 522/99 |
| 4,659,649 | 4/1987 | Dickinson et al. | 430/280 |
| 4,698,386 | 10/1987 | Fujimoto | 524/862 |
| 4,780,486 | 10/1988 | Lee et al. | 522/14 |
| 4,788,240 | 11/1988 | Fujimoto | 524/290 |
| 4,885,254 | 12/1989 | Sung | 534/588 |
| 4,935,455 | 6/1990 | Huy et al. | 522/99 |
| 5,037,763 | 8/1991 | Petisce | 436/172 |
| 5,047,443 | 9/1991 | DeVoe et al. | 522/99 |

OTHER PUBLICATIONS

Chemical Abstracts, Index Guide, N-Z, 1989, p. 1328G.
RD-247016 (abstract), Nov. 10, 1984.
Derwent Abstract, JO1204902, Aug. 17, 1989.
Derwent Abstract, JO1297483, Nov. 30, 1989.

*Primary Examiner*—Susan Berman
*Attorney, Agent, or Firm*—Roger H. Borrousch

[57] ABSTRACT

Adding a dye with a visible color to an ultraviolet radiation curable composition which contains a photoinitiator which generates free radicals upon exposure to ultraviolet radiation produces a composition which changes visible color upon exposure to ultraviolet radiation. This visible color change indicates that the composition has cured. This cure indication is useful for compositions curable by ultraviolet radiation in the electronics and electrical industry.

27 Claims, No Drawings

METHOD OF INDICATING A CURE POINT FOR ULTRAVIOLET RADIATION CURING COMPOSITIONS BY COLOR CHANGE

This is a continuation-in-part of copending application Ser. No. 07/635,061 filed on Dec. 28, 1990 now abandoned.

BACKGROUND OF THE INVENTION

1. Field of the Invention

This invention relates to a method of curing compositions by ultraviolet radiation.

2. Background Information

The curing of an ultraviolet radiation curable composition upon exposure to ultraviolet radiation varies with the kind of ingredients making up the composition, the kind of equipment used for generating the ultraviolet radiation, the geometry of the device having a film, coating, or encapsulant to be cured, and the curing conditions to which the device is exposed. These variables make it difficult to determine at what point the composition is sufficiently cured. Many times to avoid the chance that a composition may be under cured, the dosage of ultraviolet (UV) radiation which is given the items to be cured are excessive. Excessive dosages may not harm the items, but it could, and furthermore, using excessive dosages is expensive and a waste of resource. Therefore, the discovery of the present method permits establishing curing conditions which can result in sufficient cure without either undercuring or overcuring.

Materials for the electrical and electronics industry need to meet stricter requirements because the electronic devices are becoming smaller and more complex. The field of printed circuit boards is no exception. The various coatings require that the materials protect the electronic devices and components from the environments which they may encounter either during processing or in use. Coating printed circuit boards with compositions which will cure to a film and which will provide the required protection without changing the designed electronic properties or otherwise damage the boards components is difficult to achieve because the components are very small and often of shapes and design which demands compositions which have special uncured properties, special curing properties, and special application properties.

Printed circuit boards often need to be protected from contamination of the electrical and electronic components. This protection can be provided by coating or encapsulating the device bearing board with a protective film to avoid or minimize the reduction in the electrical performance due to contamination. Moisture and humidity are considered to be the worst contaminant because it must be dealt with in most environments. Moisture and humidity can drastically lower insulation resistance between conductors, accelerate high voltage breakdown, accelerate dendritic growth, and corrode the conductors. Other than moisture, chemical contaminants from the environment such as dust, dirt, solvents, acids, fungus, oils, and fuels or which are used in the manufacturing process such as organic solvents, fluxes, vapors, acids, release agents, and metal dust. Handling a printed circuit board can also cause contamination, for example, from fingerprints. Conformal coatings are also used to protect the electronic components from the harmful aspects of extremes in temperature, shock, and abrasion.

Many conformal coatings and potting compositions are known in the art and are available commercially. Each has its advantages and disadvantages. One prior art conformal coating material is based on acrylics. Acrylic coatings make excellent coating and potting systems because they have desirable electrical and physical properties, are resistant to fungus growth, have a long life, low or no exotherm during cure, and have little or no shrinkage during cure. From some viewpoints, the acrylic coating systems have a production advantage because they can be readily applied by spraying, dipping, or brushing. However, this is also a disadvantage because the films are formed from solvent containing acrylic systems. The evaporation of the solvent is a slow and expensive step and the solvent vapors need to be controlled for environmental reasons. The solvents typically used are the chlorinated solvents, such as trichloroethane and methylene chloride.

The combined impact of high energy costs and more stringent control regulations which restrict emissions of volatile solvents into the atmosphere has created a need in the coatings industry for high solids or solventless systems which do not require a large amount of energy for conversion of the system into a high performance coating. Coatings which are 100% solids are known and have a rapid cure at a relatively low conversion energy demand. Such coatings are acrylated coatings which cure by ultraviolet radiation or by electron beam exposure. These are all reasons why it is important to have the ability to know when a UV curable composition is cured so that extra energy usage is avoided and the cost is kept to a minimum.

SUMMARY OF THE INVENTION

This invention relates to a method of indicating a cure point of an ultraviolet radiation curing composition comprising adding a non-cure inhibiting amount of a dye with a visible color to an ultraviolet radiation curable composition comprising a photoinitiator which generates free radicals upon exposure to ultraviolet radiation and at least one material which cures upon exposure to ultraviolet radiation and thereafter exposing the resulting composition to a dosage of ultraviolet radiation which causes the visible color to either disappear or change to a different color indicating that cure has occurred coincidentally, where the amount of the dye is less than 30 parts by weight per one million parts by weight of the composition and where the dye is selected from the group consisting of an anthraquinone dye having a Color Index Solvent Blue 104, 1-hydroxy-4-[(methylphenyl)amino]-9,10-anthracenedione, and an azo dye mixture of azo benzene azo naphthyl benzene amine alkyl/alkoxy derivatives having a Color Index Solvent Blue 99 and azo benzene azo naphthyl benzene amine alkyl derivatives having a Color Index Solvent Red 166.

DETAILED DESCRIPTION OF THE PREFERRED EMBODIMENTS

The method of the present invention permits a user of ultraviolet radiation curable compositions to be assured that the resulting material is fully cured. This is accomplished without overcuring by observation of visible color change. This color change occurs when a non-inhibiting amount (less than 30 parts by weight per one million parts by weight of composition) of a dye with a visible color is added to a composition which cures by exposure to ultraviolet radiation. The change can be from blue to yellow, from red to yellow, from blue to clear, and from yellow to clear. This color change usually lasts over long time periods and does not return upon standing. If the cure is not sufficiently complete, the original color will return upon standing over a period of time, such as from a few minutes, to an hour or more, to a couple weeks. For purposes of this invention, the use of the term "visible dye" means a dye which will impart a color under ordinary visible light. Also, the color changes are those which are observable in ordinary visible light.

The visible dyes useful in the present invention are those which, in the presence of free radical generating photoinitiators, changes color upon exposure to ultraviolet radiation. This color change occurs and is essentially permanent at the point that a UV curable composition is cured upon exposure to UV radiation. The visible dyes useful in the present invention are selected from an anthraquinone dye having a Color Index Solvent Blue 104, 1-hydroxy-4-[(methylphenyl)amino]-9,10-anthracenedione, and an azo dye mixture of azo benzene azo naphthyl benzene amine alkyl/alkoxy derivatives having a Color Index Solvent Blue 99 and azo benzene azo naphthyl benzene amine alkyl derivatives having a Color Index Solvent Red 166. Examples of these dyes include Sandoz Nitro Fast 2B Blue which is a proprietary anthraquinone dye having a C.I. Solvent Blue 104 sold by Sandoz Chemicals, Charlotte, N.C.; Hytherm Purple KIF which is an anthraquinone dye, 1-hydroxy-4-[(methylphenyl)amino]-9,10-anthracenedione, and having a C.I. Solvent Violet 13, sold by Morton Thiokol, Inc. Morton Chemical Division, Chicago, Ill.; and DuPont Oil Purple Liquid which is an azo dye mixture of azo benzene azo naphthyl benzene amine alkyl/alkoxy derivatives having a C.I. Solvent Blue 99 and azo benzene azo naphthyl benzene amine alkyl derivatives having a C.I. Solvent Red 166.

The amount of visible dye useful in a particular UV curable composition should be an amount less than that amount which will inhibit the cure of the composition upon exposure to UV radiation. For many compositions, the amount will be less than 30 ppm based on the weight of the UV curable composition. From experience, the amount is preferably from about 10 ppm to 30 ppm of the visible dye based on the weight of the UV curable composition. It was found that amounts of the visible dye which became too high inhibit the cure of the UV curable composition. The optimum amounts of visible dye in a given composition can readily be determined by adding a specific amount of visible dye to the composition and observing the color change, or lack thereof, upon exposure to UV radiation. If too much dye is added, no color change takes place, indicating the composition did not cure. At this point, one can increase the dosage of UV to determine whether the reason it did not cure was that the dosage was too low. Further, evaluation can be used to determine whether the amount of visible dye concentration is too high. The dye must be one which changes in color at the point of cure by a sufficient degree that the color change is readily distinguishable when the composition is being cured in thin films or coatings of a few millimeters thickness.

The UV curable compositions in which this color change can occur are those which contain a photoinitiator which produces free radicals upon exposure to UV radiation and in which there is at least one material which cures upon exposure to UV radiation. Example of photoinitiators which generate free radicals include benzophenone, acetonaphthone, acetophenone, benzoin methyl ether, benzoin isobutyl ether, 2-hydroxy-2-methyl-1-phenylpropan-1-one, 1-hydroxycyclohexylphenyl ketone, 2,2-diethoxyacetophenone, 3-hydroxypropylphenyl ketone, 3-hydroxypropyl-p-isopropylphenyl ketone, and mixtures there of such as a mixture of 50 weight percent of 1-hydroxycyclohexylphenyl ketone and 50 weight percent benzophenone.

The amount of photoinitiator is that amount which is conventionally required by the particular composition for curing it.

The UV curable compositions which can be used in the present invention are those which are curable by photoinitiators which produce free radicals. These compositions can be either silicone compositions, organic compositions or compositions which contain both silicone compounds (includes polymers) which will cure by exposure to UV radiation in the presence of a free radical photoinitiator and organic compounds (includes polymers) which cure by exposure to UV radiation in the presence of a free radical photoinitiator. These compositions are well known in the art and include, that are not limited to, those which are described herein. Some of the preferred embodiments of UV curable compositions useful in the present method are described below. The compositions containing the visible dye and photoinitiator are exposed to UV radiation from conventional equipment and under conditions normally used for such compositions wherein adjustments are made to reach the cure point by observation of the color change. The point at which cure is achieved results in a color change. Therefore, the length of time or the dosage of UV radiation can be varied to produce the required cure.

A. UV Curable Compositions Which Cure to Gels

Compositions curable to gels can be those organosiloxane compositions which retain their gel properties at low temperature. These organosiloxane compositions cure in the presence of UV radiation and comprise an alkenyl-containing polymethylsiloxane with a specified combination of mono-, di- and trifunctional siloxane units, an amount of a mercaptoalkyl-containing polyorganosiloxane in an amount sufficient to cure the composition to a soft, repairable gel and an amount of a photoinitiator sufficient to initiate curing of the composition in the presence of UV radiation.

The alkenyl-containing polymethylsiloxane consists essentially of 80 to 97 mol percent of $(CH_3)_2SiO$ units, 2 to 10 mol percent of $CH_3SiO_{1.5}$ units, 1 to 6 mol percent of $(CH_3)_3SiO_{0.5}$ units, and 0.2 to 4 mol percent of units represented by the formula $(CH_3)_aR^1SiO_{(3-a)/2}$, where $R^1$ represents 3-cyclohexenyl, cyclohexenylethyl or $CH_2=CH(CH_2)_x-$, a is 1 or 2, and x represents 0 or an integer from 1 to 6, inclusive. The alkenyl-containing polymethylsiloxanes are preferably liquids under ambient conditions.

These alkenyl-containing polymethylsiloxanes in which the alkenyl group is vinyl is described in U.S. Pat. No. 4,374,967, which issued to Paul. Brown et al. on Feb. 22, 1983. A preferred class of alkenyl-substituted polymethylsiloxanes contain from 87 to 95 mol percent of dimethylsiloxane units, from 3 to 6 mol percent of monomethylsiloxy units, from 1.5 to 5 mol percent of trimethylsiloxy units and from 0.5 to 1.5 mol percent of dimethylvinylsiloxy units.

Mercaptoalkyl-containing compounds are combined with the alkenyl-containing polymethylsiloxane. The mercaptoalkyl-containing compounds include a liquid organic compound containing an average of at least two mercapto groups per molecule or a liquid mercaptoalkyl-containing polydiorganosiloxane having an average of at least two repeating units per molecule corresponding to the formula

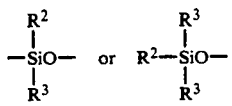

where $R^2$ represents a mercaptoalkyl radical, $R^3$ represents a monovalent hydrocarbon or halohydrocarbon radical. The compositions are prepared by combining the alkenyl-containing polymethylsiloxane with the mercapto-containing compound such that the molar ratio of mercapto groups to alkenyl radicals in said composition is 1 or less.

Preferred embodiments of the mercapto-containing polyorganosiloxane can be represented by the general formula

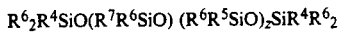

where $R^7$ represents a mercaptoalkyl radical containing from 2 to 6 carbon atoms, each $R^6$ represents methyl, phenyl, or 3,3,3-trifluoropropyl, $R^4$ represents $R^6$, $R^7$ or a hydroxyl group, each $R^5$ is methyl or phenyl, y and z are each 0 or greater, with the proviso that $R^4$ represents a mercaptoalkyl radical when both y and z are 0. Most preferably the radicals represented by $R^6$, $R^4$ and $R^5$ are methyl, and ingredient B is represented by the average formula

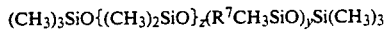

where $R^7$, y and z have the same definitions as above and y is at least 2. $R^7$ is preferably 3-mercaptopropyl or mercaptoisobutyl. y is preferably from 40 to 45 inclusive and z is preferably from 3 to about 10.

The organic compounds containing an average of at least 2 mercapto (—SH) groups per molecule also contain carbon, hydrogen and, optionally, oxygen. These organic compounds preferably contain from 2 to 6 mercapto groups per molecule. The organic compound can be, for example, but are not limited to, 2,2'-dimercaptodiethylether, dipentaerythritolhexa(3-mercaptopropionate), glycol dimercaptoacetate, trimethylolpropane trithioglycolate and trimethylolpropane trimercaptopropionate.

The UV curable compositions which cure to gels and which are useful for the present invention are those which contain photoinitiators which generate free radicals. The photoinitiator is present in an amount sufficient to promote curing of the composition upon exposure to UV radiation.

The photoinitiator should be compatible with the other ingredients of the present compositions. Compatibility can readily be determined by blending one weight percent of the candidate photoinitiator with the other liquid ingredients of the UV curable composition and mixing the resultant composition at room temperature or with heating to a temperature of about 80° C. The resultant composition should be optically clear without any dispersed or precipitated material. The photoinitiators are exemplified above.

In addition to the alkenyl-containing polymethylsiloxane, mercapto-containing compound, and photoinitiator, the present compositions can contain up to about one weight percent of conventional viscosity stabilizers to inhibit gelation during storage. Examples of suitable viscosity stabilizers include amines such as 2-(diisopropylamino)ethanol and trioctylamine, and free radical scavengers such as p-methoxyphenol, catechol, hydroquinone, and 2,6-di-t-butyl-p-methylphenol.

It may be desirable to include an organic peroxide that decomposes at a temperature within the range of from about 100° C. to about 250° C. This is particularly true if the substrate to which the composition will be applied is contoured such that a portion of the curable composition is shielded from the ultraviolet radiation to which the coated substrate is subsequently exposed for the purpose of curing the gel composition.

The UV curable compositions can contain a reinforcing filler or other type of reinforcing agent to improve the physical properties of the cured material. In those applications where transparency of the cured gel is a requirement the reinforcing agent is preferably a finely divided hydrophobic silica of the type described in U.S. Pat. No. 4,344,800, issued to Michael A. Lutz on Aug. 17, 1982. The disclosure of this patent is incorporated into this specification by reference thereto as a teaching of silica fillers suitable for use in the optically clear gel compositions of this invention.

The ingredients of the compositions are blended to form a homogeneous mixture using any of the known techniques that will not adversely affect the storage stability of the composition in the absence of ultraviolet light. Unless the composition exhibits borderline storage stability in the absence of UV radiation, the order in which the ingredients are added is not critical. If the ingredients have a tendency to react, it is preferable that the alkenyl-containing polymethylsiloxane be combined first with by the viscosity stabilizer and, lastly, the mercapto-containing compound and photoinitiator. Curable compositions containing a viscosity stabilizer can typically be stored for longer than about 6 months under ambient conditions.

The compositions cure rapidly, typically requiring about one second or less of exposure to UV radiation from a medium pressure mercury vapor arc lamp. The amount of energy required to cure preferred compositions is from 0.1 to about 3 joules per square centimeter, depending upon the ingredients and the thickness of the layer of curable composition applied to a substrate.

The intensity of the UV radiation used to cure the compositions can be measured using any of the available techniques. A preferred method employs an integrating photometer which is exposed to a mercury vapor arc lamp or other source of UV radiation under the same conditions used to cure the coated substrate. A commercially available integrating photometer is the "Light Bug" available from International Light. With the method of the present invention, the visible dye is added to the composition and upon exposure to UV radiation, the color changes when cure is achieved. This will eliminate the necessity to constantly check with a photometer during manufacturing operations. In those instances, where a wet film of the composition is exposed to the UV radiation and the color does not change or the color returns after a short period of time, it is apparent that the dosage is insufficient.

These organosiloxane gels can include uses as protective coatings and encapsulants for electrical and electronic components, particularly solid state devices such as integrated circuits, and electrical connectors. The gel can prevent penetration of atmospheric moisture and other materials that can corrode or otherwise damage the component.

An example of such UV curable compositions which cure to gels is described by Lee et al in U.S. Pat. No. 5,063,102, issued Nov. 5, 1991, and is hereby incorporated by reference to show UV radiation curable compositions useful in the present invention.

Other compositions which cure to gels and useful in the present invention comprise an acrylamide functional polyorganosiloxane of the general formula

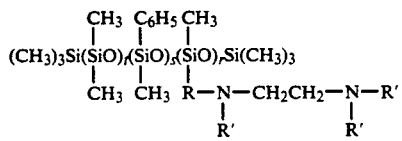

in which t is an average of at least 44 and has a value such that the mol percentage of dimethylsiloxane units in the polydiorganosiloxane is from 88 to 94.5, s has an average value of at least 2.5 and has a value such that the mol percentage of methylphenylsiloxane units is from 5 to 10, r is at least 1 and less than 2, R is a divalent alkylene radical having 3 or 4 carbon atoms, each R' is a hydrogen atom or an acyl radical of the formula

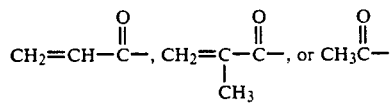

where at least 15 percent of the R' are

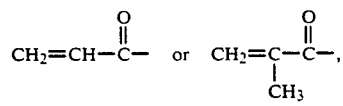

and a curing amount of a photoinitiator which generates free radicals when exposed to UV radiation.

UV curable compositions useful in this invention comprise a blend of acryl functional polydiorganosiloxanes and a photosensitization system for curing the blend when irradiated with UV radiation, wherein the blend is 4 to 90 mole percent of an acryl functional endblocked polydiorganosiloxane of the general formula $$YR^{10}{}_2SiO(R^9{}_2SiO)_nSiR^{10}{}_2Y,$$

9 to 50 mole percent of a mono-acryl functional endblocked polydiorganosiloxane of the general formula

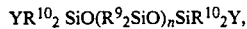

and 0 to 65 mole percent of a non-functional polydiorganosiloxane of the general formula

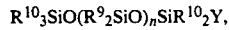

where, in the above formulae, $R^9$ is a monovalent radical selected from the group consisting of alkyl, aryl, and fluorinated alkyl; each $R^{10}$ is independently selected from the group consisting of $R^9$, hydroxyl, and a hydrolyzable group, Y is an acryl functional radical bonded to silicon atom through silicon-carbon bond where the acryl function has the formula

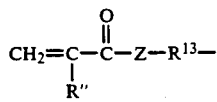

or the formula

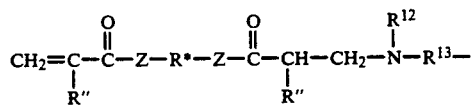

in which R" is a hydrogen atom or methyl, Z is divalent oxygen or $-N(R^{12})-$, $R^{12}$ is a hydrogen atom or an alkyl of 1-4 carbon atoms, $R^{13}$ is a divalent hydrocarbon radical having from 1 to 10 carbon atoms per radical, R* is a divalent hydrocarbon radical or a divalent hydrocarbon radical containing ether linkages and n has a value of from 30 to 3,000, the mole percentages being based on the total blend as 100 mole percent and where the polydiorganosiloxanes of the blend are present in amounts to provide 20 to 95 percent of the endblocking as acryl functionality and 5 to 80 percent of the endblocking as non-functional.

B. UV Curable Silicone Organic Conformal Coating Compositions

Some preferred conformal coating compositions are those UV radiation curable compositions containing aliphatic unsaturated functional silicone resin, an organic mercaptan, an acrylate monomer, a photoinitiator, and a free radical inhibitor wherein the photoinitiator is a free radical generating photoinitiator. In accordance with the present invention visible dye is added to them and then they are exposed to UV radiation and cure is achieved when the color change occurs.

The compositions consists essentially of the silicone resin having a general average unit formula

in which each $R^i$ in each unit is independently a monovalent organic radical where at least 10 mole percent of the total $R^i$ are phenyl radicals and at least two $R^i$ per molecule are aliphatic unsaturated radicals which react with mercapto functionality, and c has an average value of from 1.2 to 1.8; the organic mercaptan composed of carbon, hydrogen, sulfur, and oxygen in which there is at least two mercapto groups per molecule; the acrylate monomer having at least one acrylate group per molecule in an amount of at least one weight percent based on the total weight of the composition; an effective amount of photoinitiator to cause the composition to cure upon exposure to UV radiation where the photoinitiator generates free radicals upon exposure to the UV radiation; and an effective amount of the free radical inhibitor to delay gelation during storage, the composition has more than two aliphatic unsaturated radicals per molecule in the silicone resin when the organic mercaptan has two mercapto groups per molecule, or more than two mercapto groups per molecule in the organic mercaptan when the silicone resin has an average of two aliphatic unsaturated radicals per molecule, or both more than two aliphatic unsaturated radicals per molecule in the silicone resin and more than two mercapto groups per molecule in the organic mercaptan, and amount of silicone resin and organic mercaptan being such that there is from 0.5 to 1.5 aliphatic unsaturated radicals in the silicone resin for each mercapto group in the organic mercaptan.

The silicone resins contain aliphatic unsaturated radicals which react with mercapto functionality. These silicone resins have an average of 1.2 to 1.8 organic radical bonded per silicon atom and at least 10 mole percent of the organic radicals are phenyl. The silicone resins have per molecule at least two aliphatic unsaturated radicals which react with mercapto functionality. The silicone resin has a general average unit formula $$R^i_c SiO_{(4-c)/2}$$

in which c has an average value of from 1.2 to 1.8 and $R^i$ is a monovalent organic radical where at least 10 mole percent of the $R^i$ are phenyl radicals and at least two $R^i$ per molecule are aliphatic unsaturated radicals which react with mercapto functionality. The general average unit formula is the summation of individual siloxane units which are $SiO_2$ units, $R^i SiO_{3/2}$ units, $R^i_2 SiO$ units, $R^i_3 SiO_{1/8}$ units and each $R^i$ in each siloxane unit is independently selected from the group as defined herein. Each siloxane unit does not need to be present in each silicone resin, but the siloxane units which are present need to provide an average value for c of from 1.2 to 1.8. $R^i$ can be independently selected from an alkyl, alkenyl, halogenated alkyl, or aryl. The alkyl radicals can be illustrated by methyl, ethyl, propyl, isopropyl, butyl, hexyl, and octyl. The alkenyl radicals can be illustrated by vinyl, allyl, cyclohexenyl, 1,2-butenyl, and 1,2-hexenyl. The halogenated alkyl radicals can be illustrated by 3,3,3-trifluoropropyl, and other chlorinated, fluorinated, and brominated alkyl radicals wherein hydrogen atoms of the alkyl radicals are replace with a halogen atom. The preferred alkenyl radicals are vinyl and hexenyl. Other preferred radicals are methyl, propyl, 3,3,3-trifluoropropyl, and phenyl. Preferred silicone resins are those which are made up of at least two siloxane units selected from the group consisting of monophenylsilsesquioxane units, monomethylsilsesquioxane units, dimethylsiloxane units, diphenylsiloxane units, methylvinylsiloxane units, dimethylvinylsiloxy units, and trimethylsiloxy units. The preferred silicone resins contain from 20 to 80 mole percent monophenylsilsesquioxane units where the remaining siloxane units can be those listed above. A more preferred class of silicone resins are those made up of from 20 to 40 mole percent monophenylsilsesquioxane units, 10 to 20 mole percent monomethylsilsesquioxane units, 20 to 35 mole percent dimethylsiloxane units, and 10 to 30 mole percent methylvinylsiloxane units. The silicone resins can be one resin or a blend of two or more resins. The silicone resins can contain residual silicon-bonded groups which result from their preparation, such as hydroxyl groups (Si—OH) and alkoxy groups (Si—OR) where R is an alkyl radical of 1 to 4 carbon atoms.

The crosslinked density, flexibility of cured products, and the modulus of cured products are controlled by selecting the amount of aliphatically unsaturated radicals in the silicone resin and the average degree of substitution of the silicon atoms by silicon-bonded carbon groups. For example, increasing the average number of aliphatically unsaturated radicals per molecule increases the modulus and decreases the flexibility with other composition parameters remaining constant. Increasing the average degree of substitution of the silicon atom increases the flexibility and decreases the modulus with the other composition parameters remaining constant. These are general guidelines and the proportional increases and decreases in the modulus and flexibility can be varied with the kinds of other R groups, the amount of phenyl, the kind of aliphatically unsaturated radicals, and the kinds and amounts of each of the siloxane units present in the silicone resin.

The organic mercaptan contains an average of at least two mercapto functional groups per molecule. In these compositions, the number of aliphatically unsaturated groups per molecule in the silicone resin is more than two, if the number of mercapto functional groups in the organic mercaptan is two, or if the number of aliphatically unsaturated groups per molecule in the silicone resin is two, then the average number of mercapto functional groups per molecule in the organic mercaptan must be more than two. These compositions can contain silicone resin having per molecule more than two aliphatically unsaturated groups per molecule and organic mercaptan having per molecule more than two mercapto functional groups. The organic mercaptans can be illustrated by the following: trimethylolpropane trithioglycolate, trimethylolpropane tri-(3-mercaptopropionate), trimethylolethane trithioglycolate, polyethylene glycol dimercaptoacetates, glycol dimercaptoacetate, and dipentaerythritol hexa-(3-mercaptopropionate). The preferred organic mercaptan is trimethylolpropane tri-(3-mercaptopropionate). Mixtures of two or more organic mercaptans can be used.

These conformal coating compositions can contain, as an ingredient to improve the corrosion resistance, improve the adhesion to printed circuit board substrates, and improve the thermal resistance, an acrylate monomer. These acrylate monomers are illustrated by trimethylolpropane trimethylacrylate, pentaerythritol tetraacrylate, ethoxylated trimethylolpropane triacrylate, pentraerytritol acrylate (contains three acrylate groups), di-(trimethylmethylolpropane tetrataacrylate), trimethylolpropane triacrylate, di-(pentraerythritol monohydroxy pentaacrylate), hydroxylethyl acrylate, hydroxylpropyl acrylate, 4-hydroxy-n-butyl acrylate, isobornyl acrylate, proprietary acrylates such as functionalized acrylates known as Sartomer 9008 (a triacrylate), Sartomer 9012 (an aliphatic triacrylate), and Sartomer 9013 (an aliphatic monoacrylate). These are sold by ARCO Chemical Company of Pennsylvania. The acrylates are used in amounts of one weight percent or more based on the total weight of the composition.

Ultraviolet radiation capable of causing free radicals to form in the composition can be used to cure the composition of this invention. The ultraviolet radiation used to generate the free radical crosslinking reaction to effect polymerization of the composition and cure requires a photosensitization system. Examples of the photosensitization systems are known in the art, some specific photoinitiators include diethoxyacetophenone, benzophenone, dimethoxyphenylacetophenone, benzoin, 2-hydroxy-2-methyl-1-phenylpropan-1-one, with optional sensitizors such as N-methyldiethanolamine, diisopropylaminoethanol, and amyldimethylaminobenzoate.

These conformal coating compositions can be prepared by mixing the ingredients at room temperature with conventional mixing equipment. In some cases the blending of the ingredients can be accomplished by some heating. Heating these ingredients can create degradation if the temperatures become too high or the duration of the heating is for prolonged periods of time. The ingredients used to make these compositions should be blended to make compatible mixtures. This compatibility is desirable to ensure that the cured products will form solid coherent coatings, films, sheets, and encapsulants with consistent properties throughout. Incompatibility can cause weak spots, fisheyes, and poor wetting of substrates on which the composition is deposited.

A method of making cured films is accomplished by first preparing the composition by mixing the silicone resin, the organic mercaptan, the acrylate monomer, the photoinitiator, and the free radical inhibitor to form a compatible, homogeneous blend, applying the composition to a substrate such as an electronics device, and then irradiating the composition with ultraviolet radiation in an amount sufficient to cure the composition.

These conformal coating compositions contain an effective amount of a free radical inhibitor to delay gelation during storage. These free radical inhibitors include p-methoxyphenol (also know as MEHQ), catechol, 4-t-butylcatechol, phenothiazine, 2,6.-di-t-butyl-p-methylphenol, and N-phenyl-2-naphthylamine. The amounts of the free radical inhibitors are from zero to one weight percent based on the weight of the composition, more preferably from 0.01 to 0.25 weight percent. The most preferred free radical inhibitors are p-methoxyphenol, phenothiazine, and mixtures thereof. The presence of hydroquinone as a free radical inhibitor appears to be undesirable from the standpoint of preparing high modulus and tensile strength cured products.

The conformal coating compositions cure very well, adhere well to electronic boards, have a mild odor, and are clear. The presence of the acrylate compound in these compositions is vital to protect copper from corroding. The compositions of the present invention exhibit improved adhesion by preventing salt water from creeping under the coating and corroding the metal. However, acrylates without the mercaptan compound exhibit insufficient cure and to obtain the excellent properties the silicone resin, mercaptan, and acrylate are required. The thermal stability of the cured films made from the compositions of this invention can be expected to improve further by substituting hexenyl group for the vinyl group in the silicone resins. The compositions of this invention cure very rapidly compared to other ultraviolet radiation cured conformal coating compositions. They also can be cured in very deep sections when peroxide is added to them. These conformal coatings can be used as mar resistant conformal and protective coatings for printed circuit boards, gaskets for automobile engines, coatings for deep cross section pottants, optical fiber coatings where the refractive index of these coatings is greater than 1.49.

The preferred composition consist essentially of silicone resin in an amount of greater than 35 weight percent, from 5 to 30 weight percent mercaptan compound, from 1 to 25 weight percent acrylate compound, from 1 to 4 weight percent photoinitiator, less than 0.05 weight percent free radical inhibitor, and when present organic peroxide in amounts of from 1 to 5 weight percent. The weight percentages are based on the total weight of the composition.

It is also expected that the mercaptopropylsiloxane and mercaptobutylsiloxane containing polymers described in Lee et al ('486) in U.S. Pat. No. 4,780,486, issued Oct. 25, 1988, may be useful as substitutes for the mercaptans of the present invention, especially those in which phenyl-containing siloxane units are also in the polymer. Additional modifications which may be useful include acrylate functional oligomers, other vinyl functional organic monomers, such as divinyl benzene, and thiol functional silicone resins.

Another example of suitable compositions which can be used in the present invention are those described by Lutz et al in U.S. Pat. No. 5,036,114, issued Jul. 30, 1991, and is hereby incorporated by reference to show UV curable silicone organic compositions. These compositions comprise a polydiorganosiloxane having on the average more than about 0.4 acrylamide functional groups per molecule and being crosslinkable by exposure to UV radiation in the presence of a photosensitization system, an effective amount of a heat stability additive selected from the group consisting of zinc naphthenate, stannous octoate, and tetraorganotitanate, and an effective amount of a photosensitization system.

Lutz et al also in copending application Ser. No. 07/805,238, filed Dec. 11, 1991, now abandoned, assigned to the same assignee as the present application and is hereby incorporated by reference to show UV curable silicone organic compositions. These compositions comprise a compatible mixture of an acrylamide functional polyorganosiloxane having an average unit formula

$$T_d R^{14}_e SiO_{(4-d-e)/2}$$

in which $R^{14}$ is a monovalent organic group where at least 5 to 10 mole percent of $R^{14}$ are aromatic based on all $R^{14}$ equal to 100 mole percent, T is an acrylamide functional group bonded to the silicon atom through a silicon-carbon bond, d has a value such that there is on the average at least 0.4 acrylamide functional group per molecule, e has a value such that the polyorganosiloxane can be applied to a substrate and cured by exposure to UV radiation, and the sum of d+e is at least 0.7, and a photosensitization system.

C. UV Curable Organic Conformal Coating Compositions

Organic conformal coating compositions combine the toughness of certain resins, low shrinkage of monofunctional nonpolar monomers, low $T_g$ resins and monomers, and adhesion promoting monofunctional and difunctional monomers. These organic conformal coating compositions have low temperature flexibility and good thermal shock resistance and electrical properties. The composition can be post cured using a peroxide which is stable at normal room temperature processing and has a long shelf life, such as six months. The composition can also contain a fire retardant. These features are obtained without the use of solvents and can be applied to substrates by dip coating, by spray coating, and brushing because of the low viscosity.

These compositions are UV curable compositions consisting essentially of a blend of 20 to 45 weight percent of an acrylated urethane oligomer containing an average of about 2 acryl groups selected from the group consisting of acrylate and methacrylate, said acrylated urethane oligomer being based on aliphatic isocyanate, and having a number average molecular weight of from 1,000 to 6,000, 5 to 25 weight percent of an acrylate selected from the group consisting of an aliphatic monofunctional acrylate ester having a molecular weight less than 1,000, a polybutadiene diacrylate having a molecular weight less than 4,000, a polyoxyalkylated diacrylate having a molecular weight less than 1,000, and a monofunctional acrylate of the general formula

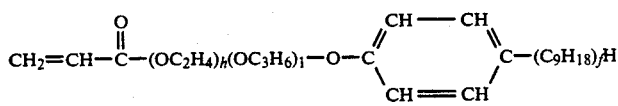

in which at least one of h or l is at least 1 and the total average value of h and l is sufficient to provide a viscosity at 25° C. of 0.01 to 0.2 Pa.s, and f is 0 or 1, 9.5 to 40 weight percent of an aliphatic bicyclic monofunctional acrylate monomer selected from the group consisting of isobornyl acrylate, isobornyl methacrylate, dicyclopentenyloxyethyl acrylate, and dicyclopentenyloxyethyl methacrylate, 0.5 to 6 weight percent of photoinitiator, 0 to 10 weight percent of an acrylate ester having at least three acrylate or methacrylate groups per molecule and having a molecular weight less than 600, 0 to 8 weight percent of a peroxide having a 10 hour half life temperature of from 85° C. to 105° C. inclusive, 0 to 10 weight percent of a hydroxy-containing acryl monomer selected from the group consisting of hydroxyalkylacrylate and hydroxyalkylmethacrylate, 0 to 20 weight percent of a fire retardant, 0 to 6 weight percent of an adhesion promoter, 1 to 1,000 ppm of polymerization inhibitor in which the inhibitor is derived from 0 to 100 ppm of 4-methoxyphenol, 0 to 500 ppm of hydroquinone, and 0 to 500 ppm of phenothiazine, 0 to 0.015 weight percent of a fluorescent dye, and the composition has a viscosity at 90° F. of less than 1 Pa.s.

These compositions are curable by exposure to UV radiation and also can be formulated so that they can be cured by exposure to heat. The compositions can be cured by exposure to UV radiation and still be made to possess the ability to cure by heating, i.e., post curing or shadow curing. These organic conformal coating compositions can be used to coat circuit boards which have complex devices or components which have undercuts, i.e. regions or locations where the coating composition will be out of sight of the UV radiation and thus would remain uncured. Compositions intended to be used for coating such circuit boards having devices with undercuts should have the ability to cure in the shadowed areas and would be formulated to contain peroxide. However, the compositions have the ability to cure via heating and thus the regions or locations which are not exposed to the UV radiation can be cured by exposure to heat. The amount of heat and the duration of the heating necessary with the composition is relatively low. The ability to cure the compositions with low amounts of heat is important because many of the electronics materials and construction can be effected by exposure to high temperatures or to heat for long durations.

These compositions contain from 20 to 45 weight percent of an acrylated urethane oligomer having an average of about 2 acrylate or methacrylate groups. These urethane oligomers are based on aliphatic isocyanate and have a number average molecular weight of from 1,000 to 6,000. The aliphatic isocyanates are preferably diisocyanates including 1,6-hexamethylene diisocyanate, 1,4-hexamethylene diisocyanate, 2,2,4-trimethylhexamethylene diisocyanate, 2,4,4-trimethylhexamethylene diisocyanate, 4,4'-methylene-bis(cyclohexyl)-isocyanate, isophorone diisocyanate, and 1-methyl-2,4-diisocyanatecyclohexane. The acrylated urethane oligomers are known in the art and those which are particularly useful in the present invention are those which are described in U.S. Pat. No. 4,607,084, issued Aug. 19, 1986, to Morris, which is hereby incorporated by reference to show the acrylated urethane oligomers and their preparation.

The acrylated urethane oligomers can be mixtures of two or more different oligomers or prepolymers, preferably a mixture of at least two different molecular weight acrylated urethane prepolymers, and a mixture of an acrylated urethane prepolymer and a polyester urethane acrylate. The acrylated urethane prepolymer provides strength to the cured films and the polyester urethane acrylate provides elongation to the cured films. They can also be blends, such as those prepared from polyether diols and polyether triols. The acrylated urethane oligomers can also contain reactive solvents. Such reactive solvents include alkyl acrylates, alkyl methacrylates, alkoxyalkyl acrylates, alkoxyalkyl methacrylates, allyl acrylate, phenoxyethyl acrylate, cyclohexyl acrylate, 1,6-hexanediol diacrylate, trimethylolpropane triacrylate, acrylated fatty alcohols, and acrylated aliphatic diglycidyl ethers. A preferred reactive solvent is ethoxyethoxyethyl acrylate. The reactive solvent can be present in amounts of from 0 to 50 weight percent based on the total weight of the acrylated urethane oligomer. Preferably, if the reactive solvent is present, it is present in an amount of from about 10 to about 20 weight percent.

The term "oligomer" and "prepolymer" are interchangeable. Some examples of commercially available acrylated urethane oligomer are as follows: Ebecryl 230 and Ebecryl 4883 sold by Radcure Specialties of Virginia. Ebecryl 230 is 100 percent solids urethane acrylate prepolymer containing no reactive diluents, has a viscosity at 25° C. of 30 to 40 Pa.s, a number average molecular weight of about 5,000, and a functionality of two. Ebecryl 4883 is 85 weight percent urethane acrylate oligomer or prepolymer and 15 weight percent tripropylene glycol diacrylate, the oligomer has a number average molecular weight of 1,611 and a viscosity at 60° C. in the range of 2.8 to 4.2 Pa.s. Uvithane 782 and Uvithane 783 sold by Morton Thiokol Corporation, Morton Chemical Division, Ill. Uvithane 782 is a polyester urethane acrylate which has a viscosity at 49° C. of 80 to 160 Pa.s and Uvithane 783 is similar except that it has a viscosity at 49° C. of 60 to 200 Pa.s.

The acrylated urethane oligomer is preferably present in an amount of from 25 to 40 weight percent. A preferred acrylated urethane oligomer is a mixture of 3 to 6 weight percent polyester urethane acrylate, such as Uvithane 782, and 19 to 32 weight percent of an acrylated urethane prepolymer having a number average molecular weight from 1,000 to 3,000, such as Ebecryl 4883, for a total of 25 to 35 weight percent acrylated urethane oligomer. Another preferred acrylated urethane oligomer is a mixture of 24 to 37 weight percent of an acrylated urethane prepolymer having a number average molecular weight of 1,000 to 3,000, such as Ebecryl 4883, and 3 to 6 weight percent of an acrylated urethane prepolymer having a number average molecular weight of 3,000 to 6,000, such as Ebecryl 230, for a total of 30 to 40 weight percent acrylated urethane oligomer.

The acrylate is a unique monomer having a low glass transition temperature, $T_g$ which gives the cured films made from these compositions improved flexibility at low temperatures and allows the cured films to pass thermal cycling shock tests. These acrylate monomers are selected from an aliphatic monofunctional acrylate ester having a molecular weight less than 1,000, a polybutadiene diacrylate having a molecular weight less than 4,000, a polyoxyalkylated diacrylate having a molecular weight less than 1,000, and a monofunctional acrylate of the general formula

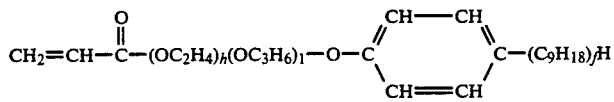

in which at least one of h or l is at least 1 and the total average value of h and l is sufficient to provide a viscosity at 25° C. of 0.01 to 0.2 Pa.s, and f is 0 or 1. An example of an aliphatic monofunctional acrylate ester is C-9013 which is sold by Sartomer Company of Pennsylvania, has a boiling point of 121° C. at 10 mmhg, has a viscosity at 25° C. of 0.005 to 0.015 Pa.s and contains 160 ppm+ or −20 ppm of 4-methoxyphenol. An example of a polybutadiene diacrylate having a molecular weight less than 4,000 is C-5000 sold by Sartomer Company of Pennsylvania, has a number average molecular weight of 3,000, a viscosity at 25° C. of 4.5 to 5 Pa.s, and contains 400 ppm BHT, a butylated hydroxy toluene. An example of a polyoxyalkylated diacylate having a molecular weight less than 1,000 is C-9000 which has a number average molecular weight of 800, a viscosity at 25° C. of 0.12 Pa.s, and 250 ppm of 4-methoxyphenol. Examples of the acrylates having Formula I are shown by the following formulae and are sold by Toagosei Chemical Industry Co., Ltd. of Tokyo, Japan:

M-101, having a viscosity of 25° C. of 0.02 Pa.a, a $T_g$ of −25° C., and a formula of

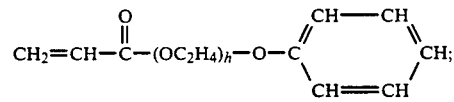

M-111, having a viscosity at 25° C. of 0.08 Pa.s, a $T_g$ of −8° C., and a formula of

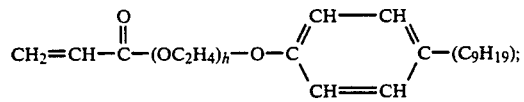

M-113, having a viscosity at 25° C. of 0.11 Pa.s, a $T_g$ of −43° C., and a formula of

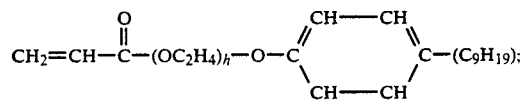

and M-117, having a viscosity at 25° C. of 0.13 Pa.s and a $T_g$ of −20° C., and a formula of

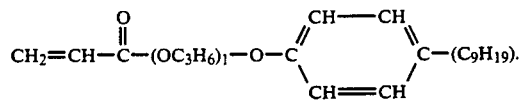

The preferred acrylate monomer is M-113, which is also known as alpha-(1-oxo-2-propenyl)-omega-(nonylphenoxy)-poly(oxy-1,2-ethanediyl). The acrylate monomer is present in an amount of from 5 to 25 weight percent of the composition, preferably 10 to 15 weight percent of the composition.

The aliphatic bicyclic monofunctional acrylate monomer selected from the group consisting of isobornyl acrylate, isobornyl methacrylate, dicyclopentenyloxyethyl acrylate of the formula

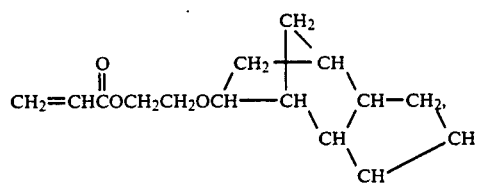

dicyclopentenyloxyethyl methacrylate of the formula

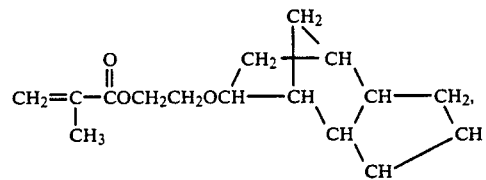

and mixtures thereof. Isobornyl acrylate has a viscosity at 25° C. of about 0.015 Pa.s and usually contains as an inhibitor 100 ppm of 4-methoxyphenol. Isobornyl methacrylate has a viscosity at 25° C. of 0.015 to 0.019 Pa.s. Dicyclopentenyloxy-ethyl acrylate has a viscosity at 25° C. of about 0.02 Pa.s. Dicyclopentenyloxyethyl methacrylate has a viscosity at 25° c. of 0.015 to 0.019 Pa.s. the aliphatic bicyclic monofunctional acrylate is present in an amount of 9.5 to 40 weight percent of the composition, preferably is present in an amount of 20 to 35 weight percent. The preferred aliphatic bicyclic monofunctional acrylate is dicyclopentenyloxy-ethyl acrylate.

The photoinitiator to provide the UV radiation curable property can be any of those which are known in the art to cure acrylates and methacrylates and generate free radicals upon exposure to UV. However, neither the photoinitiator nor its by-products should be corrosive to the electronic materials which it will come in contact with during its use. Illustrative of the photoinitiators are 2,2-diethoxyacetophenone, benzoin methyl ether, benzoin ethyl ether, benzoin isopropyl ether, alpha-methylbenzoin, alpha-ethyl-benzoin, alpha-methyl benzoin methyl ether, alpha-phenylbenzoin, alpha-allylbenzoin, anthraquinone, methylanthraquinone, ethyl-anthraquinone, tertiary butylanthraquinone, benzil, diacetyl, benzaldehyde, acetophenone, benzophenone, omega-benzoin, 2,3-pentanedione, hydroxycyclohexylphenyl ketone, hydroxymethyl phenylpropanone, and xanthone. The photoinitiator is used in amounts of from 0.5 to 6 weight percent of the composition and which are suitable to provide cure of the composition when it is exposed to UV radiation. The preferred photoinitiator is 2-hydroxy-2-methyl-1-phenyl-propan-1-one and the preferred amount is from 2 to 5 weight percent of the composition.

The acrylate ester is one having at least three acrylate or methacrylate groups per molecule and a molecular weight less than 600. These acrylate esters can be present in amounts of from 0 to 10 weight percent of the composition. Preferably, the acrylate ester is present in an amount of at least 0.1 weight percent of the composition with the most preferred amounts being from 3 to 8 weight percent of the composition. Some examples of the acrylate esters are trimethylolpropane trimethylacrylate (mol. wt.=338), pentaerythritol tetraacrylate (mol. wt.=352), ethoxyated trimethylolpropane triacrylate (mol. wt.=428), pentaerythritol acrylate (contain three acrylate groups, mol. wt.=298), di-trimethylolpropane tetraacrylate (mol. wt.=438), tirmethylolpropane triacrylate (mol. wt.=296), and di-pentaerythritol monohydroxy pentaacrylate (mol. wt.=524). These acrylate esters are available commercially and are usually sold with an inhibitor present. Some of these commercially available acrylate esters may also contain small amounts of solvent which is a result of their preparation. The preferred acrylate ester is di-pentaerythritol monohydroxy pentaacrylate.

The organic peroxide can be present in an amount sufficient to provide cure when the composition is exposed to heat after the composition is cured by exposure to UV radiation. The amount of organic peroxide can be from 0 to 8 weight percent of the composition. The organic peroxide is one which has a 10 hour half life temperature of from 85° C. to 105° C. inclusive. Peroxides which have this 10 hour half life temperature provides compositions which can be packaged in one container for shipment, i.e. they have an acceptable shelf life for commercial shipping. These peroxides also can be cured at an acceptable temperature when the application is for conformal coatings on printed circuit boards. When the compositions of this invention are used for printed circuit boards which have devices with undercuts, it is preferred to have the organic peroxide present in amounts of from 0.1 to 6 weight percent of the composition, so that the compositions can be cured in the shadowed areas by heating. The preferred amount of organic peroxide is at least 0.5 weight percent of the composition, with the most preferred amounts being from 0.5 to 4 weight percent. Thus, the organic peroxide is one which will provide a storage stable uncured composition, which will cure upon heating, and which will not produce acidic by-products that can cause corrosion to electronic materials. Suitable organic peroxides include the following where the 10 hour half life temperature is in parentheses following the peroxide name, 1,1- bis(t-butylperoxy) cyclohexane (93° C.), o,o-tertiary-butyl-o-isopropyl monoperoxy carbonate (99° C.), 2,5-dimethyl-2,5-di-(2-ethylhexanoylperoxy) hexane (87° C.), 1,1-di(t-butylperoxy)-3,3,5-trimethylcylcohexane (92° C.), 2,2-di(t-butyl-peroxy) butane (104° C.), and 1-cyano-1-(t-butylazo) cyclohexane (96° C.). The preferred organic peroxide is 1,1-bis(tertiary-butylperoxy) cyclohexane and the preferred amounts of this peroxide are 0.5 to 4 weight percent. It might be possible to use organic peroxides which have 10 hour half life temperatures between 105° C. and 130° C. if the compositions are to be used on substrates which are very heat stable, such as on certain ceramic printed circuit boards. The preferred organic peroxide is 1,1-bis(t-butylperoxy) cyclohexane.

The hydroxy-containing acryl monomer in amounts of from 0 to 10 weight percent of the composition. The hydroxy-containing acryl monomer can be a hydroxyalkylacrylate or a hydroxyalkylmethacrylate. The hydroxy-containing acryl monomer can be illustrated by hydroxyethyl acrylate, hydroxypropyl acrylate, 4-hydroxy-n-butyl acrylate, hydroxyethyl methacrylate, hydroxypropyl methacrylate, and 4-hydroxy-n-butyl methacrylate. The preferred hydroxy-containing acryl monomer is hydroxyethyl methacrylate. The hydroxy-containing acryl monomer is preferably present in amounts of 0.5 weight percent of the composition and the more preferred compositions contain from 3 to 9 weight percent. The hydroxy-containing acryl monomer reduces the viscosity of the composition and also increases the adhesion of the cured films to substrates.

The fire retardant can be trixylenol phosphate. The amount of fire retardant can be from 0 to 20 weight percent of the composition, preferably in amounts of at least 1 weight percent of the composition. A preferred composition contain fire retardant in an amount of from 3 to 10 weight percent and it is preferably trixylenyl phosphate. Because many of the fire retardants can be corrosive to the electronic materials and components, the selection of a fire retardant should be considered carefully and preferably tested before it is used, to determine whether it will be corrosive. The preferred fire retardants are the triorganic phosphates, such as the trixylenyl phosphate. The halogenated fire retardants are known to be too corrosive to be useful in the compositions of this invention because they corrode the electronic components which come into contact with the cured composition.

The adhesion promoter can be present in amounts of from 0 to 6 weight percent of the composition. The adhesion promoter is preferably a phosphorus material of the formula

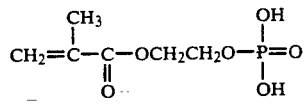

and a mixture of compounds of the formulae

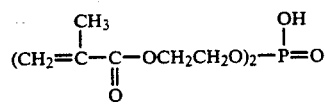

and

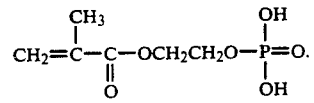

These phosphorus materials increase the adhesion of the cured films to various substrates, specifically to copper, tin, G-10 boards, and electronic components. The amount of adhesion promoter is preferably at least 0.1 weight percent of the composition and is preferably the mixture of phosphorus materials defined above in amounts of from 2 to 4 weight percent.

These organic conformal coating compositions need to have from 1 to 1,000 ppm by weight of a polymerization inhibitor percent based on the total weight of the composition wherein the inhibitor is derived from 0 to 100 ppm of 4-methoxy-phenol, 0 to 500 ppm of hydroquinone, and 0 to 500 ppm of phenothiazine. These inhibitors can be present from the other ingredients or can be added to give the proper shelf stability. The inhibitor is preferably present in an amount of at least 100 ppm by weight based on the total weight of the composition. The most preferred compositions have from 200 to 500 ppm by weight of polymerization inhibitor where a mixture of hydroquinone and phenothiazine are each present in amounts of from 100 to 300 ppm by weight.

These compositions can also contain a fluorescent dye in amounts of from 0 to 0.015 weight percent of the composition. These fluorescent dyes are used to determine the degree of coverage of the films on the printed circuit boards so that one can be sure that the film covers all of the areas necessary and to the film thickness desired or required for a particular printed circuit board. The preferred compositions contain at least 0.005 weight percent of a fluorescent dye and the most preferred compositions contain from 0.005 to 0.01 weight percent of fluorescent dye. An example of a fluorescent dye is Uvitex OB.

The organic conformal coating compositions may contain other ingredients such as fungicides, as long as these materials do not add to the corrosive nature of the composition or deleteriously effect the electrical properties of the uncured composition or the cured product.

These compositions are ones in which the composition will not corrode the electronic components which it contacts either in the uncured or cured state. The composition is essentially neutral and must not contain ingredients which may change this neutrality. A change in neutrality results in a composition which causes corrosion to materials used in electronic components. For example, the composition of the present invention should not contain amines, such as the tertiary organic amines which are often used as photosensitizers, because these amines cause corrosion to metal substrates found in the electronic components. Also acidic materials should not be used in the compositions of the present invention because these materials also cause corrosion.

These compositions are particularly useful in coating and encapsulating electronic components because the viscosity of the composition is less than 1 Pa.s at 90° F. Circuit boards can be dipped into this coating composition, allowed to drip to an even coat, then exposed to ultraviolet radiation for a few seconds for curing, and in those situations where post curing is required, the coated boards are heated to complete the curing cycle. These compositions can also be sprayed or brushed onto the circuit boards. Under certain coating circumstances or with certain combinations of composition and substrate, dewetting of the coating on the substrate might be experienced. If such a problem is encountered, such as might result from contamination of the substrate surface, a surfactant can be added to the composition. However, surfactants can cause foaming during preparative steps, as well as, during the coating steps and therefore is not recommended. If the use of a surfactant cannot be avoided, a recommended surfactant is one of the glycol siloxane type, such as Dow Corning® 57 paint additive. Amounts of surfactant up to about 2 weight percent have been found to be effective. Surfactants may also cause the composition to be hazy. After the curing step or steps are completed, the boards can be tested, used, or shipped immediately. For the purposes of this application the terms printed wire boards and printed circuit boards refer to the same type of article of manufacture.

These compositions have a long pot life, a long shelf life, low temperature flexibility which is sufficient to provide stress relieving properties on coated printed circuit boards, pass thermal shock test, cure fast, are easy to use in production, are essentially solvent free, are a one package (one part or one component) system, have good electrical properties and can be made flame retardant without substantially changing the other characteristics of the present invention. The shelf life of the compositions of this invention which contain organic peroxide can be extended by keeping the composition from contacting temperature above 25° C., and if one has concern about the stability of the composition on storage, the compositions can be stored under refrigeration.

These compositions can be prepared by mixing the ingredients. The method of mixing is not particularly critical except that the ingredients should be mixed to homogeneity. Because some of the ingredients may be more viscous than others, the mixing procedure maybe more difficult and slight heating may help readily disperse the ingredients. However, if heat is used, it would be preferred to leave the peroxide out of the mixture until it is cooled to room temperature. The peroxide is sensitive to heat and may cause some unwanted reaction if present during any heating during the preparation procedure. It may also be an advantage if the polymerization inhibitors are present during the early stages of the mixing procedure. After the composition is prepared, it is stored in containers which protect it from ultraviolet radiation until cure is desired. When peroxide is present, care should be taken to avoid high temperatures, especially for prolonged periods of time.

These compositions can be cured by exposure to ultraviolet radiation, and if peroxide is present thereafter heated to cure any portion of the coating or encapsulant which did not receive ultraviolet radiation. Such heating will cause the composition to cure in the dark regions (regions not receiving ultraviolet radiation exposure) and thus the compositions of this invention have the ability to shadow cure. If these compositions are heat cured before they are exposed to ultraviolet radiation, the surface of the resulting film will be tacky. Surfaces which are tacky are unacceptable on printed circuit boards.

A preferred composition consists essentially of a blend of from 25 to 35 weight percent of an acrylated urethane oligomer mixture made up of 19 to 32 weight percent acrylated urethane prepolymer and from 3 to 6 weight percent of polyester urethane acrylate, from 10 to 15 weight percent alpha-(1-oxo-2-propenyl)-omega-(nonylphenoxy)-poly(oxy-1,2-ethanediyl) having a viscosity at 25° C. of from 0.1 to 0.12 Pa.s, from 20 to 35 weight percent isobornyl acrylate, from 2 to 3 weight percent 2-hydroxy-2-methyl-1-phenyl-propan-1-one, from 4 to 8 weight percent dipentaerythritol monohydroxy pentaacrylate, from 1.5 to 4 weight percent 1,1-bis-(tertiary-butylperoxy) cyclohexane, from 3 to 6 weight percent 2-hydroxyethylmethacrylate, from 5 to 10 weight percent trixylenyl phosphate, from 2 to 3 weight percent of a mixture of compounds of the formulae

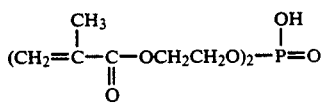

and

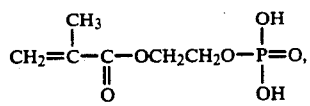

from 200 to 500 ppm of a mixture of hydroquinone and phenothiazine each being present in an amount of from 100 to 300 ppm, and from 0.005 to 0.01 weight percent of a fluorescent dye. This preferred composition exhibits the advantageous properties as described herein for conformal coatings, but it was observed for some formulations the cured films developed a tackiness on the surface over a short period of time, such as a within one month after being cured. This surface tackiness was more pronounced with formulations containing the higher concentrations of isobornyl acrylate.

Compositions which did not develop this surface tackiness of the cured films were discovered. These compositions consist essentially of a blend of from 30 to 40 weight percent of a mixture made up of 24 to 37 weight percent of an acrylated urethane prepolymer having a number average molecular weight of from 1,000 to 3,000 and of 3 to 6 weight percent of an acrylated urethane prepolymer having a number average molecular weight of from 3,000 to 6,000, from 10 to 15 weight percent alpha-(1-oxo-2-propenyl)-omega-(nonylphenoxy)-poly(oxy-1,2-ethanediyl) having a viscosity at 25° C. of from 0.1 to 0.12 Pa.s, from 25 to 35 weight percent of dicyclopentenyloxyethyl acrylate, from 3 to 5 weight percent 2-hydroxy-2-methyl-1-phenyl-propan-1-one, from 3 to 7 weight percent dipentaerythritol monohydroxy pentaacrylate, from 0.5 to 2 weight percent 1,1-bis-(tertiary-butylperoxy) cyclohexane, from 4 to 9 weight percent 2-hydroxyethyl-methacrylate, from 3 to 8 weight percent trixylenyl phosphate, from 2 to 4 weight percent of a mixture of compounds of the formulae

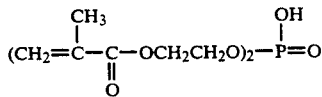

and

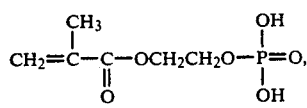

from 200 to 500 ppm of a mixture of hydroquinone and phenothiazine each being present in an amount of from 100 to 300 ppm, and from 0.005 to 0.01 weight percent of a fluorescent dye. These preferred compositions do not develop surface tackiness on the cured film. However, the tensile strength is observed to be a lower value, but still acceptable for conformal coatings. In addition to overcoming cured surface tackiness, those compositions which are used as conformal coatings for printed wire boards desirably contain the 2 to 4 weight percent of the phosphorus containing adhesion promoter to ensure adhesion of the cured film to the board to prevent board failure due to atmospheric contamination such as moisture (corrosion).

These compositions have solvent resistance to such solvents as xylene, acetone, isopropanol, methyl ethyl ketone, freons, and urethane thinners. Adhesion of the cured compositions to metal and plastic substrates, such as metal leads and plastic connector materials, is obtained. The compositions are non-corrosive before, during, and after cure, where cure includes both the ultraviolet cure and the post heat cure. The compositions have the ability to withstand thermal shock from $-65°$ C. to $150°$ C. The compositions of this invention exhibit a low weight loss upon cure. The compositions exhibit acceptable electrical properties for use as insulative coatings and encapsulants for electronic components, such as volume resistivity and dielectric withstanding voltage. The composition of the present invention exhibits sufficient fungus resistance without the addition of additional fungicides, but in certain applications it may be advantageous to add to this fungus resistance. If additional fungicide is needed, careful evaluation of the fungicide should be conducted to determine its effect on other properties, such as corrosion. The compositions also exhibit humidity resistance and resistance to soldering heat. If fire retardant properties more than provided by the composition are needed, the fire retardant as describe above should be used.

Other kinds of UV curable compositions which can be used in this invention can be found in U.S. Pat. No. 4,780,486, issued Oct. 25, 1988, issued to Chi-long Lee and Michael A. Lutz.

The method of the present invention can be used for UV curable compositions which make films, coatings, encapsulants in the electrical and electronics industries such as for printed circuit boards, electrical connectors and electrical splices.

The following examples are presented for illustrative purposes and should not be construed as limiting the invention which is properly delineated in the claims. In the following examples, "part" or "parts" represents "part by weight" or "parts by weight", "%" are percent by weight unless otherwise stated.

EXAMPLE 1

A curable composition of this invention was prepared by blending 0.002 part of an anthraquinone dye purchased from Sandoz Chemical, Charlotte, N.C. as Nitro-Fast Blue 2B, (which is also known as C.I. Solvent Blue 104) with the following ingredients to homogeneity:

97.5 parts of an organosiloxane copolymer containing the following units, expressed in mol percent: 94% dimethylsiloxane units, 1% dimethylvinylsiloxy units, 2% trimethylsiloxy units, and 3% monomethylsiloxy units. The viscosity of the copolymer was $10^{-5}$ m$^2$/s at 25° C.;

1.25 parts of a trimethylsiloxy-terminated polydiorgano-siloxane copolymer containing an average of 43 dimethylsiloxane units and 4 methyl(3-mercaptopropyl)siloxane units per molecule; and 1.25 parts of 2-hydroxy-2-methyl-1-phenylpropan-1-one as the photoinitiator.

The blended composition was blue. A 10 g sample of the blue composition was passed through a UV-6 Single Lamp Conveyorized UV Curing Unit manufactured by Colight, Minneapolis, Minn. The conveyor was set at about 3 ft/min and the lamp was at 200 watts. The composition changed to light yellow and was fully cured. The cured sample remained yellow for at least six months.

EXAMPLE 2

An ultraviolet radiation curable siloxane composition was prepared by adding 0.002 part of Nitro-Fast Blue 2B to a mixture of 65.5 parts of a silicone resin having the average siloxane unit formula $(MeSiO_{3/2})_{7.5}(PhSiO_{3/2})_{37.6}(Me_2SiO)_{30.1}(MeViSiO)_{20.0}-$ $(Me_3SiO_{\frac{1}{2}})_{4.8}(OH)_h$ which had a vinyl content of 5.2 weight percent, a value for h to provide an OH content of 1.49 weight percent, a non-volatile content of 97.4 weight percent, and a viscosity of 14.5 Pa.s, 17.5 parts of an organic mercaptofunctional compound having the formula $$CH_3CH_2C(CH_2OCCH_2CH_2SH)_3$$
$$\quad\quad\quad\quad\quad \overset{O}{\underset{\|}{}}$$

{trimethylolpropane tri-(3-mercaptopropionate)]}[TMPTMP], 10 parts of tripropylene glycol diacrylate [TRPGDA], 5 parts of isobornyl acrylate [IBA], 3.08 parts of photoinitiator of the formula $$HO(CH_3)_2C-\overset{O}{\underset{\|}{C}}-C_6H_5$$

and 0.005 part of a UV dye fluorescent indicator, Uvitex OB. A sample of this mixture was blue and after exposing it to UV radiation as described in Example 1, it turned yellow and remained yellow.

EXAMPLE 3

A UV curable organic composition in accordance with this invention was prepared by adding 0.002 part of Nitro-Fast Blue 2B to a mixture prepared by blending at room temperature in a container which protects the composition from exposure to ultraviolet radiation, until the mixture was homogeneous Ebecryl 4883, Ebecryl 230, QM-672, 2-hydroxyethyl methacrylate, alpha-(1-oxo-2propenyl)-omega-(nonylphenoxy)-poly(oxy-1,2-ethanediyl) (M-113), trixylenyl phosphate, 2-hydroxy-2-methyl-1-phenylpropan-1-one (Darocur 1173), adhesion promoter (PM-2), dipentaerythritol monohydroxy pentaacrylate, fluorescent dye, inhibitors, and 1,1-bis-(tertiary-butylperoxy) cyclohexane. The resulting composition was a conformal coating composition which cured both by exposure to ultraviolet radiation and by heating. The ingredients and their amounts were as shown as follows:

| Percent | Ingredient |
|---|---|
| 4.36 | Acrylated urethane prepolymer. Ebecryl 230 sold by Radcure Specialties, Virginia |
| 28.8 | Dicyclopentenyloxyethyl acrylate, QM-672 sold by Rohm and Haas Company of Pennsylvania |
| 7.6 | 2-Hydroxyethyl methacrylate, sold as Rocryl 400 by Rohm and Haas Company of Pennsylvania |
| 13.1 | M-113 sold by Toagosei Chemical Industry Co., Ltd, of Tokyo, Japan |
| 4.36 | Trixylenyl phosphate, Kronitex(R) TXP sold by FMC Corporation, Industrial Chemical Group Pennsylvania |
| 4.18 | Darocur(R) 1173, sold by EM Chemicals, EM Industries Company, Hawthorne, New York |
| 1.74 | Kayamer PM-2, sold by Nippon Kayaku Co., Ltd., Plastic Division, Tokyo, Japan, this is the mixture of phosphorus material having the formulae described herein for the adhesion promoter |
| 30.5 | Acrylated urethane oligomer, Ebecryl 4883 sold by Radcure Specialties, Virginia, this material is 85% acrylated urethane oligomer and 15% tripropylene glycol diacrylate |
| 4.36 | Dipentaerythritol monohydroxy pentaacrylate, SR-399, sold by Sartomer Company, Division of Sartomer Industries, Inc., Pennsylvania |
| 1.0 | 1,1-bis-(t-butylperoxy)cyclohexane, SP-400P sold by Witco Chemical, U.S. Peroxygen Division, California |
| 0.009 | Uvitex OB, fluorescent dye |
| 200 ppm | Hydroquinone |
| 200 ppm | Phenothiazine |

This mixture was blue and had a viscosity of 0.42 Pa.s at 25° C., HAV, spindle number 3, 50 rpm, at 2 minutes. When this mixture was exposed to ultraviolet radiation as described in Example 1, it changed to yellow and was fully cured.

EXAMPLE 4

UV curable compositions were prepared as described in Example 1, except the 2-hydroxy-2-methyl-1-phenyl-propan-1-one were left out and another photoinitiator was used in its place as indicated below. The mixtures were prepared by mixing 0.79 part of the photoinitiators listed below with 49.5 parts of the UV curable composition as described in Example 1 but without the 2-hydroxy-2-methyl-1-phenylpropan-1-one. The Colight system used to expose the samples to UV radiation was the same as described in Example 1. The results observed were as described below along with the photoinitiator used in each case.

Sample 1: Benzophenone: passed through the Colight system once did not cure or change color, a second pass through the Colight system changed the color a little to a paler blue and the film was slightly cured, after four passes through the Colight system the blue was almost gone.

Sample 2:

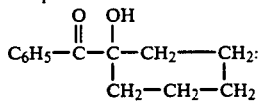

passed through the Colight system once produced a good cure and the color changed to yellow.

Sample 3: Diethoxyacetophenone passed through the Colight system once produced a good cure and the color changed to dark yellow.

Sample 4: A mixture of 50 weight percent

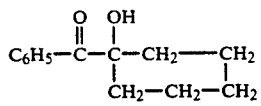

and 50 weight percent benzophenone passed through the Colight system once produced a good cure and the color changed to dark yellow. This yellow was the same as observed for Sample 3.

These samples showed that the color change occurred with different kinds of free radical producing photoinitiators.

EXAMPLE 5

A masterbatch of a ultraviolet radiation curable composition was prepared and used by blending with various dyes at various dye concentrations as described below. This masterbatch was prepared by mixing 1.25 parts by weight of a trimethylsiloxy-terminated polydiorganosiloxane copolymer containing an average of 43 dimethylsiloxane units and 4 methyl(3-mercaptopropyl)siloxane units per molecule with 25 parts by weight methyl hydroquinone (added in the form of a 10 weight percent solution in toluene) per million parts by weight of the composition. The resulting mixture was then added to and mixed in a metal can with 97.5 parts by weight of an organosiloxane copolymer containing the following units, expressed in mole percent: 94% dimethylsiloxane units, 1% dimethylvinylsiloxy units, 2% trimethylsiloxy units, and 3% monomethylsilsesquioxane units. After the resulting mixture was thoroughly mixed, 1.25 parts by weight of 2-hydroxy-2-methyl-1-phenylpropan-1-one as the photoinitiator was added and the total mixture was mixed by rolling for 30 minutes on a can roller. Each of the dyes described below were added to a quantity of masterbatch ultraviolet radiation curable material by mixing and then shaking the resulting mixture until a uniform dispersion of the dye in the masterbatch was obtained. The dye containing mixture was allowed to de-air at ambient conditions. For each dye containing masterbatch, 15 grams of the masterbatch was placed in a 4 ounce round-bottle and cured by exposure for 22 seconds to ultraviolet irradiation (UV) from a medium pressure mercury bulb with a power of 200 watts per inch where the dye containing masterbatch was placed about 65 mm from the bulb. The bulb was in a UVEXS Modular Cure Unit (MCU), from UVEXS, Inc., Sunnyvale, Cal. Another 15 grams of dye containing masterbatch was poured into the bottle over the dye containing masterbatch which had been exposed to the UV, and then the second 15 grams of masterbatch was exposed to UV from the MCU unit for 22 seconds. A third 15 grams of dye containing masterbatch was poured into the bottle over the second 15 grams of dye containing masterbatch which had been exposed to UV from the MCU unit for 22 seconds. The three 15 grams quantities of dye containing masterbatch were required to obtain sufficient depth for measuring the penetration of the UV exposed materials. The penetration was determined by a blunt head shaft penetrometer with a weight bead of 19.5 +/−0.05 g. The head was positioned at the surfce of the gel and the head was then released with gravity pulling the head into the gel. The distance the head drops from the surface into the gel in five seconds was the penetration value. The penetration results were reported in tenths of a millimeter.

The results obtained from each dye are described below.

Dye A: 1 part by weight of Sandoz Nitro Fast 2B Blue (an anthraquinone dye having a C.I. Solvent Blue 104, sold by Sandoz Chemicals, Charlotte, N.C.) was dispersed in 99 parts by weight of toluene. Uncured dye containing masterbatch at 25 ppm of dye was blue and became light yellow when exposed to curing UV radiation. The cured film had a penetration value of 128 initially and after aging at ambient conditions for 35 days and the color remained yellow, which indicated a good cure. Uncured dye containing masterbatch at 58 ppm dye was deep blue and became a deep yellow when exposed to curing UV radiation and became dark green-yellow after aging at ambient conditions for 35 days which indicated that the film was not completely cured. The initial cured film had a penetration of 135 which showed that the film was softer and after aging at ambient conditions the film had a penetration of 152 which showed instability of the film and a softening indicating an incomplete cure. Uncured dye containing masterbatch at 100 ppm dye was dark blue and became muddy blue-brown after exposure to curing UV radiation and became dark muddy blue-green after aging 35 days at ambient condition. The initial penetration value was 149 which showed that the film had not cured thoroughly and the penetration value increase to 161 after aging at ambient conditions for 35 days. This softening showed that the film was not stable and that the cure was incomplete.

Dye B: 1 part by weight of Hytherm Purple KIF (an anthraquinone dye, 1-hydroxy-4-[(methylphenyl)amino]-9,10-anthracenedione, sold by Morton Thiokol, Inc., Morton Chemical Division, Chicago, Ill.) was dispersed in 99 parts by weight of toluene. Uncured dye containing masterbatch at 25 ppm dye was purple and became light yellow after exposure to curing UV radiation and after 35 days aging at ambient conditions the film was still yellow. The initial penetration value was 130 and the value after aging for 35 days was 143 which showed some softening but the color remained yellow indicating that the film was cured.

Dye C: 1 part by weight of DuPont Oil Purple Liquid [an azo dye mixture, azo benzene azo naphthyl benzene amine alkyl/alkoxy derivatives (C.I. Solvent Blue 99) and azo benzene azo naphthyl benzene amine alkyl derivatives (C.I. Solvent Red 166), sold by DuPont Chemicals, Wilmington, Del.] dispersed in 99 parts by weight of toluene. Uncured dye containing masterbatch at 25 ppm dye was pale blue-violet and became very light yellow after exposure to curing UV radiation and the color remained yellow after aging for 35 days at ambient conditions. The film had a penetration of 127 initially and 151 after 35 days aging at ambient conditions. Although the film softened, the color did not change over the aging period which indicated that the film was cured.

Dye D: 1 part by weight of Sandoz Sando Plast Red 2B powder (an anthraquinone dye, 1-amino-2-bromo-4-hydroxyanthraquinone, sold by Sandoz Chemicals, Charlotte, N.C.) was dispersed in 99 parts by weight of toluene. Uncured dye containing masterbatch at 25 ppm dye was light pink and became salmon pink after being exposed to curing UV radiation. This color change would be insufficient in thinner films to make a distinction between cured and uncured. (Comparison experiment).

Dye E: 1 part by weight of methylene blue was dispersed in 99 parts by weight of isopropyl alcohol. Uncured dye containing masterbatch at 25 ppm dye was pale violet and became very light blue after exposure to curing UV radiation. This color change would be insufficient in thinner films to make a distinction between cured and uncured. (Comparison experiment).

Dye F: 3 parts by weight of Sandoz Nitro Fast Yellow B powder (a disazo dye, also known as C.I. Solvent Yellow 30, C.I. 21240, having a formula $C_{37}H_{36}N_4O_2$ and a CAS number 3321-10-6) sold by Sandoz Chemicals, Charlotte, N.C.) was dispersed in 97 parts by weight of methylphenylvinylsiloxy terminated polydimethylsiloxane having a viscosity of about 0.4 Pa.s. Uncured dye containing masterbatch at 9 ppm dye was deep yellow and became light yellow after exposure to curing UV radiation. This color change is insufficient to distinguish between cured and uncured film when the film is in thin thicknesses. (Comparison experiment).

Dye G: 1 part by weight of Uvitex OB, [a fluorescent dye having no visible color, 2,2'-(2,5-thiophenediyl)-bis(5-tertbutylbenzoxazole) CAS Reg No. 7128-64-5, sold by Ciba-Geigy Corporation, Plastics & Additives Division, Hawthorne, N.Y.] was dispersed in 99 parts by weight of toluene. Uncured dye containing masterbatch was water white and after being exposed to curing UV radiation the composition did not cure and remained water white. (Comparison experiment).

Dye H: 1 part by weight of Calco Oil Red (a disazo dye sold by BASF Corporation Chemicals Division, Parsippany, N.J.) dispersed in 99 parts by weight of toluene. Uncured dye containing masterbatch was pale red and became light yellow after being exposed to curing UV radiation. This film became too soft on aging and it was difficult to see it on a device. (Comparison experiment).

Dye I: 1 part by weight of Calcozine Blue 2R-EG Liquid (also known as Blue G Liquid, a triphenylmethane dye, sold by BASF Corporation Chemicals Division, Parsippany, N.J.) dispersed in 99 parts by weight of toluene. Uncured dye containing masterbatch was light blue and became very light yellow after being exposed to curing UV radiation. This film became too soft on aging and it was difficult to see it on a device. (Comparison experiment).

Dye J: 1 part by weight of DuPont Oil Blue B Liquid Dye [an anthraquinone dye, 1-4-bis[(2-ethylhexyl/methyl/phenyl)-amino] anthraquinone, sold by DuPont Chemicals, Wilmington, Del.] dispersed in 99 parts by weight of toluene. Uncured dye containing masterbatch was pale blue and became very light yellow after being exposed to curing UV radiation. This film became too soft on aging and it was difficult to see it on a device. (Comparison experiment).

No Dye: Uncured masterbatch without any dye was water white and became light yellow after being exposed to curing UV radiation.

That which is claimed is:

1. A method of indicating a cure point of an ultraviolet radiation curing composition comprising adding a non-cure inhibiting amount of a dye with a visible color to an ultraviolet radiation curable composition comprising a photoinitiator which generates free radicals upon exposure to ultraviolet radiation and at least one material which cures upon exposure to ultraviolet radiation and thereafter exposing the resulting composition to a dosage of ultraviolet radiation which causes the visible color to either disappear or change to a different color indicating that cure has occurred coincidentally, where the amount of the dye is less than 30 parts by weight per one million parts by weight of the composition and where the dye is selected from the group consisting of an anthraquinone dye having a Color Index Solvent Blue 104, 1-hydroxy-4-[(methylphenyl)amino]-9,10-anthracenedione, and an azo dye mixture of azo benzene azo naphthyl benzene amine alkyl/alkoxy derivatives having a Color Index Solvent Blue 99 and azo benzene azo naphthyl benzene amine alkyl derivatives having a Color Index Solvent Red 166.

2. The method of claim 1 in which the dye is an anthraquinone dye having a Color Index Solvent Blue 104.

3. The method of claim 1 in which the dye is 1-hydroxy-4-[(methylphenyl)amino]-9,10-anthracenedione.

4. The method of claim 1 in which the dye is an azo dye mixture of azo benzene azo naphthyl benzene amine alkyl/alkoxy derivatives having a Color Index Solvent Blue 99 and azo benzene azo naphthyl benzene amine alkyl derivatives having a Color Index Solvent Red 166.

5. The method of claim 1 in which the ultraviolet radiation curable composition is a silicone composition.

6. The method of claim 1 in which the ultraviolet radiation curable composition is an organic composition.

7. The method of claim 5 in which the material which cures upon exposure to ultraviolet radiation is an organosiloxane gel composition comprising an alkenyl-containing polymethylsiloxane consisting essentially of 80 to 97 mole percent of $(CH_3)_2SiO$ units, 2 to 10 mol percent of $CH_3SiO_{0.5}$ units, 1 to 6 mol percent of $(CH_3)_3SiO_{0.5}$ units and 0.2 to 4 mol percent of units represented by the formula $(CH_3)_aR^1SiO_{(3-a)/2}$, where $R^1$ represents 3-cyclohexenyl, cyclohexenylethyl or $CH_2=CH(CH_2)_x$, a is 1 or 2, and x represents 0 or an integer from 1 to 6, inclusive; and a mercaptoalkyl-containing compound selected from the group consisting of a liquid organic compound having an average of at least two mercapto groups per molecule and a liquid mercaptoalkyl-containing polydiorganosiloxane containing an average of at least two repeating units per molecule corresponding to the formula

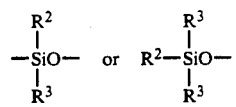

where $R^2$ represents a mercaptoalkyl radical, $R^3$ represents a monovalent hydrocarbon or halohydrocarbon radical, and said curing agent is compatible with the other ingredients of said composition; and where the molar ratio of mercapto groups to alkenyl radicals in material is 1 or less.

8. The method of claim 7 where $R^1$ is vinyl, mercaptoalkyl-containing compound is represented by the general formula

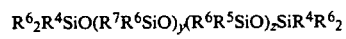

where $R^7$ represents a mercaptoalkyl radical containing from 2 to 6 carbon atoms, each $R^6$ represents methyl, phenyl, or 3,3,3-trifluoropropyl, $R^4$ represents $R^6$, $R^7$ or a hydroxyl group, $R^5$ is methyl or phenyl, and y and z are each 0 or greater, with the proviso that $R^4$ represents a mercaptoalkyl radical when both y and z are 0.

9. The method of claim 7 in which the dye is an anthraquinone dye having a Color Index Solvent Blue 104.

10. The method of claim 8 in which the dye is an anthraquinone dye having a Color Index Solvent Blue 104.

11. The method of claim 7 in which the photoinitiator is 2-hydroxy-2-methyl-1-phenylpropan-1-one.

12. The method of claim 8 in which the photoinitiator is 2-hydroxy-2-methyl-1-phenylpropan-1-one.

13. The method of claim 9 in which the photoinitiator is 2-hydroxy-2-methyl-1-phenylpropan-1-one.

14. The method of claim 10 in which the photoinitiator is 2-hydroxy-2-methyl-1-phenylpropan-1-one.

15. The method of claim 5 in which the material is a composition consisting essentially of a silicone resin having a general average unit formula $$R^i_c SiO_{(4-c)/2}$$

in which each $R^i$ in each unit is independently a monovalent organic radical where at least 10 mole percent of the total $R^i$ are phenyl radicals and at least two $R^i$ per molecule are aliphatic unsaturated radicals which react with mercapto functionality, and c has an average value of from 1.2 to 1.8; an organic mercaptan composed of carbon, hydrogen, sulfur, and oxygen in which there is at least two mercapto groups per molecule; an acrylate monomer having at least one acrylate group per molecule in an amount of at least one weight percent based on the total weight of the composition; an effective amount of a free radical inhibitor to delay gelation during storage, the composition has more than two aliphatic unsaturated radicals per molecule in the silicone resin when the organic mercaptan has two mercapto groups per molecule, or more than two mercapto groups per molecule in the organic mercaptan when the silicone resin has an average of two aliphatic unsaturated radicals per molecule, or both more than two aliphatic unsaturated radicals per molecule in the silicone resin and more than two mercapto groups per molecule in the organic mercaptan, and amount of silicone resin and organic mercaptan being such that there is from 0.5 to 1.5 aliphatic unsaturated radicals in the silicone resin for each mercapto group in the organic mercaptan.

16. The method of claim 15 in which the silicone resin consists essentially of at least two siloxane units selected from the group consisting of monophenylsilsesquioxane, monomethylsilsequioxane, dimethylsiloxane, diphenylsiloxane, methylvinylsiloxane, dimethylvinylsiloxy, and trimethylsiloxy.

17. The method of claim 16 in which the silicone resin is made up of 20 to 40 mol percent monophenylsilsesquioxane units, 10 to 20 mol percent monomethylsilsesquioxane units, 20 to 35 mol percent dimethylsiloxane units, and 10 to 30 mol percent methylvinylsiloxane units.

18. The method of claim 15 in which the dye is an anthraquinone dye having a Color Index Solvent Blue 104.

19. The method of claim 17 in which the dye is an anthraquinone dye having a Color Index Solvent Blue 104.

20. The method of claim 18 in which the photoinitiator is 2-hydroxy-2-methyl-1-phenylpropan-1-one.

21. The method of claim 19 in which the photoinitiator is 2-hydroxy-2-methyl-1-phenylpropan-1-one.

22. The method of claim 6 in which the ultraviolet curable composition consisting essentially of a blend of 20 to 45 weight percent of an acrylated urethane oligomer containing an average of about 2 acryl groups selected from the group consisting of acrylate and methacrylate, said acrylated urethane oligomer being based on aliphatic isocyanate, and having a number average molecular weight of from 1,000 to 6,000; 5 to 25 weight percent of an acrylate selected from the group consisting of an aliphatic monofunctional acrylate ester having a molecular weight less than 1,000, a polybutadiene diacrylate having a molecular weight less than 4,000, a polyoxyalkylated diacrylate having a molecular weight less than 1,000, and a monofunctional acrylate of the general formula

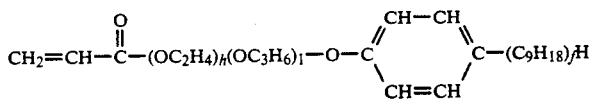

in which at least one of h or l is at least 1 and the total average value of h and l is sufficient to provide a viscosity at 25° C. of 0.01 to 0.2 Pa.s, and c is 0 or 1; 9.5 to 40 weight percent of an aliphatic bicyclic monofunctional acrylate monomer selected from the group consisting of isobornyl acrylate, isobornyl methacrylate, dicyclopentenyloxyethyl acrylate, dicyclopentenyloxyethyl methacrylate, and mixtures thereof; 0.5 to 6 weight percent of photoinitiator; 0 to 10 weight percent of an acrylate ester having at least three acrylate or methacrylate groups per molecule and having a molecular weight less than 600; 0 to 8 weight percent of a peroxide having a 10 hour half life temperature of from 85° C. to 105° C. inclusive; 0 to 10 weight percent of a hydroxy-containing acryl monomer selected from the group consisting of hydroxyalkyl-acrylate and hydroxyalkylmethacrylate; 0 to 20 weight percent of a fire retardant; 0 to 6 weight percent of an adhesion promoter; 1 to 1,000 ppm of polymerization inhibitor in which the inhibitor is derived from 0 to 100 ppm of 4-methoxyphenol, 0 to 500 ppm of hydroquinone, and 0 to 500 ppm of phenothiazine; 0 to 0.015 weight percent of a fluorescent dye, and the composition has a viscosity at 90° F. of less than 1 Pa.s.

23. The method of claim 22 in which the acrylate is present in an amount of from 10 to 15 weight percent, the aliphatic bicyclic monofunctional acrylate monomer is present in an amount of from 20 to 35 weight percent, the photoinitiator is present in an amount of from 2 to 5 weight percent, the acrylate ester is present in an amount of from 3 to 8 weight percent, the peroxide is present in an amount of from 0.5 to 4 weight percent, the hydroxy-containing acryl monomer is present in an amount of from 3 to 9 weight percent, the fire retardant is present in an amount of from 3 to 10 weight percent, the adhesion promoter is present in an amount of from 2 to 4 weight percent, the polymerization inhibitor is present in an amount of from 200 to 500 ppm, and the fluorescent dye is present in an amount of from 0.005 to 0.01.

24. The method of claim 22 in which the dye is an anthraquinone dye having a Color Index Solvent Blue 104.

25. The method of claim 23 in which the dye is an anthraquinone dye having a Color Index Solvent Blue 104.

26. The method of claim 24 in which the photoinitiator is 2-hydroxy-2-methyl-1-phenylpropan-1-one.

27. The method of claim 25 in which the photoinitiator is 2-hydroxy-2-methyl-1-phenylpropan-1-one.

* * * * *